United States Patent
Guo et al.

(10) Patent No.: US 9,559,259 B2
(45) Date of Patent: Jan. 31, 2017

(54) LIGHT-EMITTING DEVICE AND MANUFACTURING METHOD THEREOF

(71) Applicant: EPISTAR CORPORATION, Hsinchu (TW)

(72) Inventors: Yi Lin Guo, Hsinchu (TW); Chen Ou, Hsinchu (TW); Chi Ling Lee, Hsinchu (TW); Wei Han Wang, Hsinchu (TW); Hung Chih Yang, Hsinchu (TW); Chi Hung Wu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 11 days.

(21) Appl. No.: 14/874,077

(22) Filed: Oct. 2, 2015

(65) Prior Publication Data
US 2016/0043277 A1     Feb. 11, 2016

Related U.S. Application Data (63) Continuation-in-part of application No. 13/731,887, filed on Dec. 31, 2012, now abandoned.

(51) Int. Cl.
*H01L 33/00* (2010.01)
*H01L 33/22* (2010.01)

(52) U.S. Cl.
CPC ........... *H01L 33/22* (2013.01); *H01L 33/0095* (2013.01)

(58) Field of Classification Search
CPC .............................. H01L 33/20; H01L 33/007
USPC ........................................................ 257/98
See application file for complete search history.

(56) References Cited

U.S. PATENT DOCUMENTS

| 7,348,603 | B2 | 3/2008 | Erchak et al. |
| 8,664,019 | B2 | 3/2014 | Lee et al. |
| 2002/0145148 | A1 | 10/2002 | Okuyama et al. |
| 2002/0179923 | A1* | 12/2002 | Morita .................. B82Y 20/00 257/103 |
| 2003/0218179 | A1 | 11/2003 | Koide et al. |
| 2005/0211995 | A1* | 9/2005 | Ou .......................... H01L 33/32 257/80 |
| 2008/0157115 | A1 | 7/2008 | Chuang et al. |
| 2009/0152578 | A1 | 6/2009 | Lee |
| 2010/0052000 | A1 | 3/2010 | Ko et al. |
| 2010/0072501 | A1 | 3/2010 | Wakai et al. |
| 2011/0244610 | A1* | 10/2011 | Saito ..................... H01L 33/007 438/29 |
| 2013/0181245 | A1 | 7/2013 | Hsu et al. |

* cited by examiner

Primary Examiner — Trung Q Dang
Assistant Examiner — Patricia Reddington
(74) Attorney, Agent, or Firm — Patterson + Sheridan, LLP (57) ABSTRACT

An LED manufacturing method includes steps of: providing a substrate including a first surface; forming a first portion of a first semiconductor layer on the first surface in a first atmosphere including a first carrier gas; and forming a second portion of the first semiconductor layer on the first portion in a second atmosphere including a second carrier gas; wherein a plurality of first cavities is formed on a surface of the first portion during forming the first portion; and wherein the plurality of first cavities is transformed to a plurality of second cavities during forming the second portion, and one of the second cavities includes a first inclined surface and a second inclined surface above the first inclined surface.

23 Claims, 8 Drawing Sheets

LIGHT-EMITTING DEVICE AND MANUFACTURING METHOD THEREOF

REFERENCE TO RELATED APPLICATION

The present application is a continuation-in-part application of U.S. patent application Ser. No. 13/731,887, filed on Dec. 31, 2012.

TECHNICAL FIELD

The application relates to an LED manufacturing method, and more particularly, to a method for manufacturing a light-emitting device comprising a semiconductor layer having a rough surface with a plurality of cavities randomly distributed on the rough surface.

DESCRIPTION OF BACKGROUND ART

The light-emitting diode (LED) is a solid state semiconductor device. The structure of the LED comprises a p-type semiconductor layer, an n-type semiconductor layer, and a light-emitting layer formed between the p-type semiconductor layer and the n-type semiconductor layer. The light-emitting principle of the LED is the transformation of electrical energy to optical energy by applying an electrical current to the p-n junction to generate electrons and holes. Then, the LED emits a light when the electrons and the holes combine.

SUMMARY OF THE DISCLOSURE

A light-emitting device includes a substrate; a first semiconductor layer formed on the substrate; a light-emitting layer on the first semiconductor layer; and a second semiconductor layer having a rough surface formed on the light-emitting layer, wherein the rough surface includes a plurality of cavities randomly distributed on the rough surface, and one of the plurality of cavities has a substantially hexagonal shape viewed from top and a curved sidewall viewed from cross-section.

A manufacturing method of a light-emitting device includes providing a substrate; growing a first semiconductor layer including a first semiconductor material on the substrate and forming a first rough surface with a plurality of cavities during growing the first semiconductor layer; and treating the first rough surface of the first semiconductor layer with a reducing gas to form a second rough surface.

An LED manufacturing method includes steps of: providing a substrate including a first surface; forming a first portion of a first semiconductor layer on the first surface in a first atmosphere including a first carrier gas; and forming a second portion of the first semiconductor layer on the first portion in a second atmosphere including a second carrier gas; wherein a plurality of first cavities is formed on a surface of the first portion during forming the first portion; and wherein the plurality of first cavities is transformed to a plurality of second cavities during forming the second portion, and one of the second cavities includes a first inclined surface and a second inclined surface above the first inclined surface.

DETAILED DESCRIPTION OF PREFERRED EMBODIMENTS

The embodiments of the application are illustrated in detail, and are plotted in the drawings. The same or the similar part is illustrated in the drawings and the specification with the same number.

Figure 1:
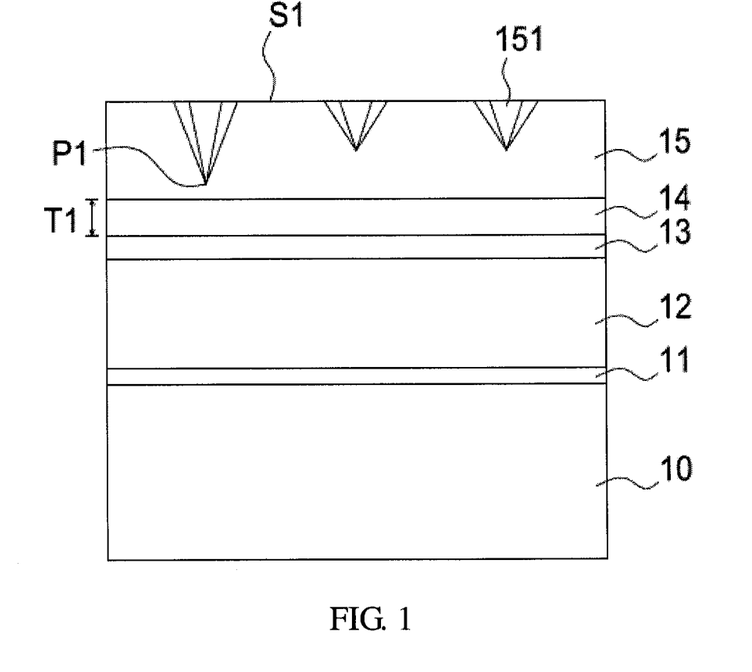
FIGS. 1-4 illustrate a manufacturing method of a light-emitting device in accordance with an embodiment of the present application.
Figure 2:
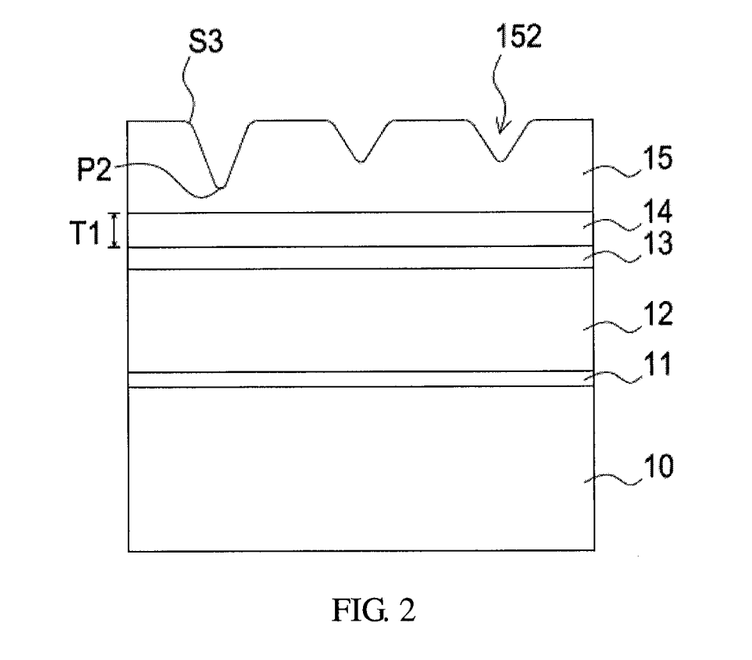
Figure 3:
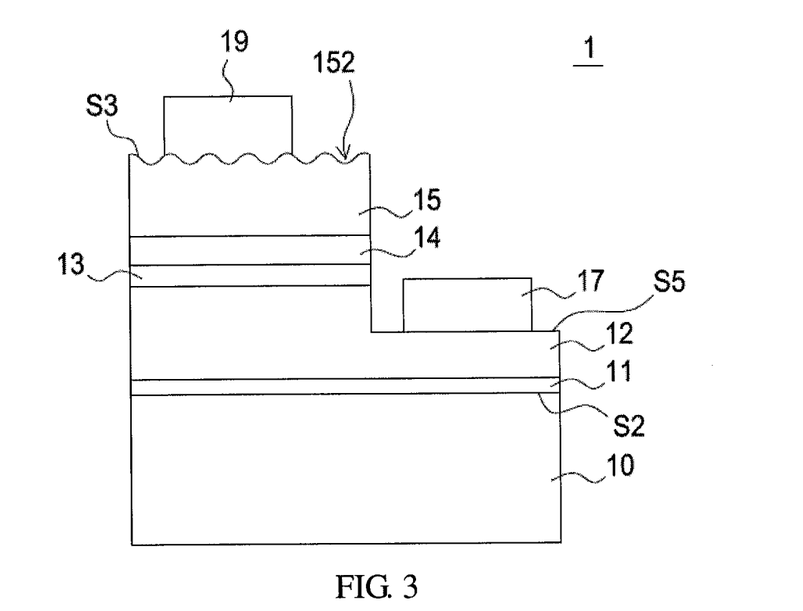
Figure 4:
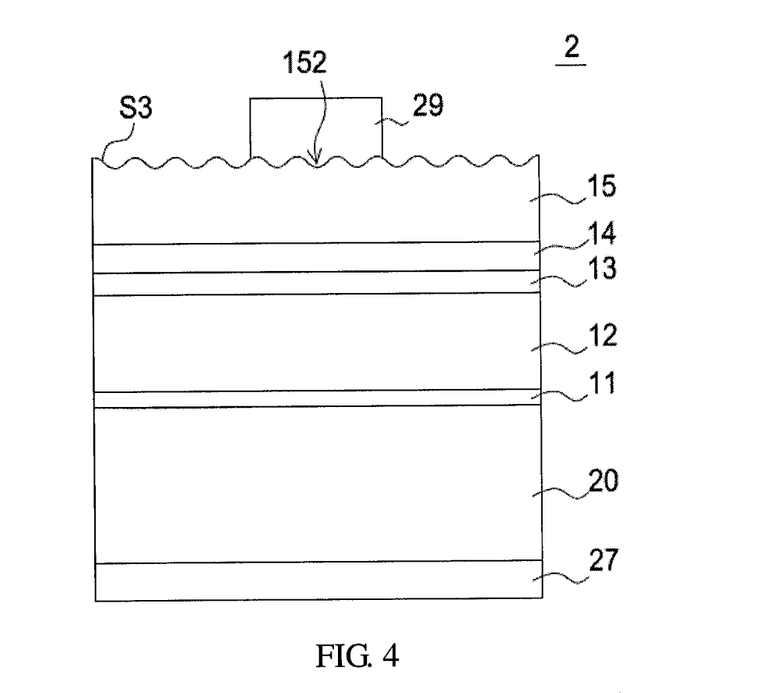

FIG. 1 to FIG. 3 illustrate a manufacturing method of a light-emitting device 1 in accordance with an embodiment of the present application. The manufacturing method includes the following steps:

Step 1: providing a substrate 10, such as a sapphire substrate;

Step 2: forming a buffer layer 11, such as AlN buffer layer, on the substrate 10;

Step 3: forming a first semiconductor layer 12 on the buffer layer 11;

Step 4: forming a light-emitting layer 13 having a structure, such as InGaN-based multiple-quantum-well (MQW) structure, on the first semiconductor layer 12. In the embodiment, the material of the first semiconductor layer 12, the light-emitting layer 13 and the second semiconductor layer 15 include group III-V A compound semiconductor such as gallium nitride (GaN);

Step 5: forming a stop layer 14 on the light-emitting layer 13 in a reaction chamber under a reduced pressure environment, such as between 50 mbar and 350 mbar and at a temperature between 700° C. and 1200° C., and nitrogen (N2) and ammonia (NH3) are introduced into the reaction chamber to be a carrier gas, wherein the material of the stop layer 14 includes AlxGa1-xN, wherein 0<x<1, and a thickness T1 of the stop layer 14 is between 50 Å and 500 Å;

Step 6: forming a second, semiconductor layer 15 having a second semiconductor material, such as p-type group III A-nitride semiconductor material, for example GaN, on the light-emitting layer 13 in the reaction chamber under a pressure between 100 mbar and 900 mbar and at a temperature between 700° C. and 1200° C., and nitrogen (N2) and ammonia (NH3) are introduced into the reaction chamber to be the carrier gas, wherein a polarity of the second semiconductor layer 15 is opposite to a polarity of the first semiconductor layer 12. The first semiconductor layer 12, the second semiconductor layer 15, or the light-emitting layer 13 may be grown in the reaction chamber by a known epitaxy method such as metallic-organic chemical vapor deposition (MOCVD) method, a molecular beam epitaxy (MBE) method, or a hydride vapor phase epitaxy (HVPE) method;

Step 7: forming a first rough surface S1 with a plurality of cavities 151 during growing the second semiconductor layer 15, wherein the cavity 151 includes a polygonal pyramid shape, such as hexagonal-pyramid shape, in a perspective view;

Step 8: treating the first rough surface S1 of the second semiconductor layer 15 by a reducing gas, such as hydrogen gas (H2), in the reaction chamber to form a second rough surface S3 under a pressure between 300 mbar and 700 mbar and at a temperature between 800° C. and 1250° C., and nitrogen (N2) and ammonia (NH3) are stopped being introduced into the reaction chamber, wherein the cavity 151 having a sharp corner shown in FIG. 1 is treated by the reducing gas to form a cavity 152 having a round corner as shown in FIG. 2. In the embodiment, the epitaxial growth surface of the second semiconductor layer 15 on the sapphire substrate is c-plane and Ga element rich. When the hydrogen gas (H2) contacts the first rough surface S1 of the second semiconductor layer 15, the c-plane is more vulnerable than other planes, such as a-plane or m-plane. In other words, the second rough surface S3 includes a crystal plane like a-plane or m-plane is less reactive with the reducing gas than c-plane. The stop layer 14 includes a chemical property less reactive with the reducing gas than the second semiconductor layer 15, and the reducing gas decomposes the second semiconductor material of the second semiconductor layer 15 to a group IIIA element, such as Ga;

Step 9: nitrogenizing the second semiconductor layer 15 after treating the first rough surface S1 of the second semiconductor layer 15 by introducing a nitrogen-containing gas, such as NH3, into the reaction chamber under a pressure between 100 mbar and 900 mbar and at a temperature between 700° C. and 1200° C., and nitrogen (N2) and ammonia (NH3) are introduced into the reaction chamber to be the carrier gas, wherein the group III A element, such as Ga, reacts with the nitrogen-containing gas, such as $NH_3$, to form the second semiconductor material of the second semiconductor layer 15, such as GaN, during the nitrogenizing step;

Step 10: forming a mesa to expose a top surface S5 of the first semiconductor layer 12 as shown in FIG. 3; and Step 11: forming a first electrode 17 on the top surface S5 of the first semiconductor layer 12, and forming a second electrode 19 on the second rough surface S3 of the second semiconductor layer 15 to complete the light-emitting device 1 being horizontal-type as shown in FIG. 3. The substrate 10 can be an insulating substrate, such as sapphire, GaN, MN, ZnO, MgO, $MgAl_2O_4$, or glass. Another example of the embodiment for a light-emitting device 2 being vertical-type is also disclosed in FIG. 4 by arranging a first electrode 27 and a second electrode 29 on opposite sides of a conductive substrate 20. The conductive substrate 20 includes a conductive material, such as metal or semiconductor. As shown in FIG. 4, the major difference between the light-emitting device 1 and the light-emitting device 2 is that the first electrode 27 and the second electrode 29 of the light-emitting device 2 are on opposite sides of the conductive substrate 20, and the first electrode 17 and the second electrode 19 of the light-emitting device 1 are on the same sides of the substrate 10.

Figure 8:
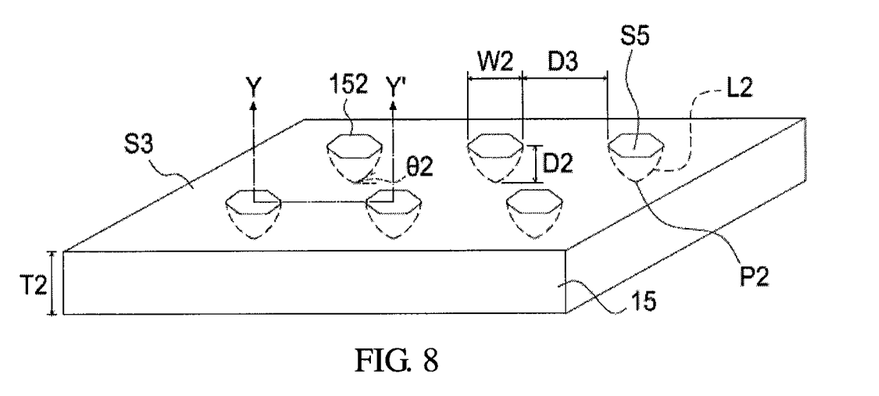
FIG. 8 illustrates a perspective diagram of a light-emitting device after reducing gas treatment in accordance with an embodiment of the present application.
Figure 9:
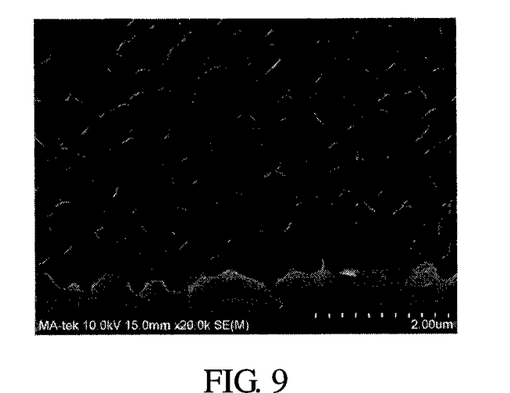
FIG. 9 illustrates a tilted SEM diagram of a light-emitting device after reducing gas treatment in accordance with an embodiment of the present application.
Figure 10:
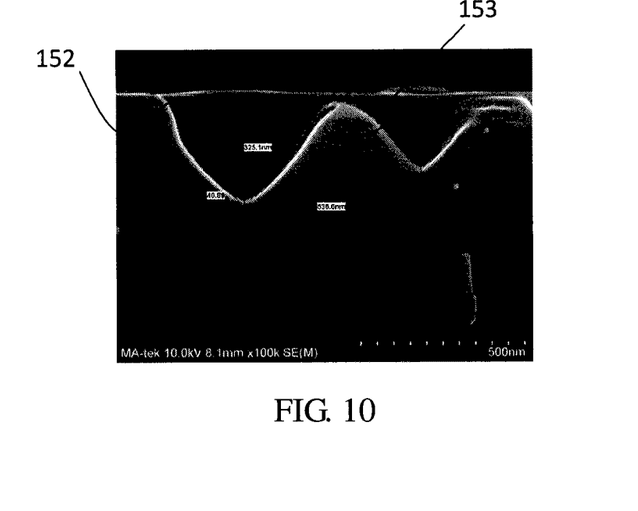
FIG. 10 illustrates a cross-sectional SEM diagram of a light-emitting device after reducing gas treatment in accordance with an embodiment of the present application.

As shown in FIG. 3, the light-emitting device 1 includes the substrate 10 having an epitaxial growth plane S2; the buffer layer 11 on the substrate 10; the first semiconductor layer 12 formed on the buffer layer 11; the light-emitting layer 13 on the first semiconductor layer 12; and the second semiconductor layer 15 having the second rough surface S3 formed on the light-emitting layer 13, wherein the second rough surface S3 includes a plurality of cavities 152 randomly distributed on the second rough surface S3, and one of the plurality of cavities 152 has a substantially hexagonal shape viewed from top and a curved sidewall viewed from cross-section as shown in FIGS. 8-10. Here, a substantially hexagonal shape means the corner of the cavity 152 is round, but overall is hexagonal shape viewed from top. The light-emitting device 1 further includes the stop layer 14 formed between the light-emitting layer 13 and the second semiconductor layer 15, wherein the stop layer 14 includes a chemical property less reactive with the reducing gas than the second semiconductor layer 15.

During the epitaxial growth of the first semiconductor layer 12, the light-emitting layer 13, and the second semiconductor layer 15, some dislocation sites are formed, and the stop layer 14 helps to prevent the reducing gas from damaging the multiple-quantum-well (MQW) structure of the light-emitting layer 13 through the dislocation site.

Figure 5:
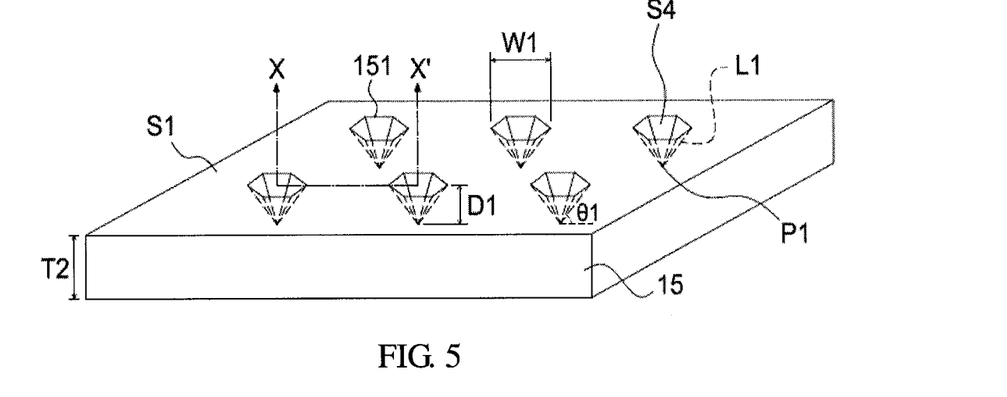
FIG. 5 illustrates a perspective diagram of a light-emitting device before reducing gas treatment in accordance with an embodiment of the present application.
Figure 6:
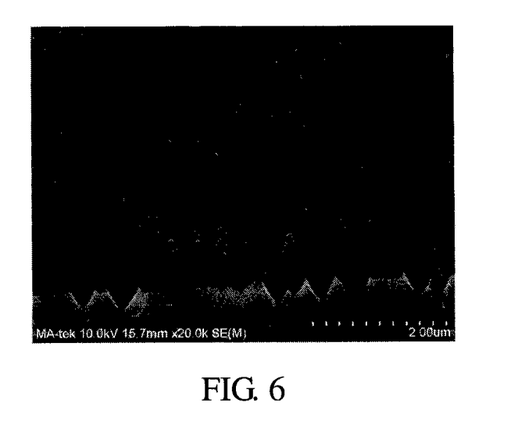
FIG. 6 illustrates a tilted SEM diagram of a light-emitting device before reducing gas treatment in accordance with an embodiment of the present application.
Figure 7:
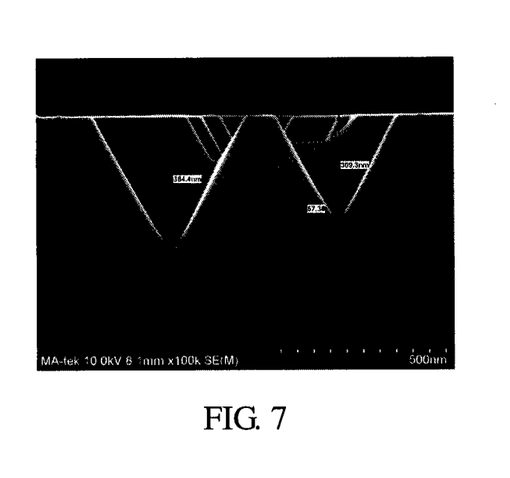
FIG. 7 illustrates a cross-sectional SEM diagram of a light-emitting device before reducing gas treatment in accordance with an embodiment of the present application.

FIG. 5 illustrates a perspective diagram of the light-emitting device 1 or 2 before reducing gas treatment. FIG. 6 illustrates a tilted SEM diagram of the light-emitting device 1 or 2 before reducing gas treatment in accordance with an embodiment of the present application. FIG. 7 illustrates a cross-sectional SEM diagram of the light-emitting device 1 or 2 before reducing gas treatment in accordance with an embodiment of the present application. As shown in FIG. 5, the cavity 151 includes a hexagonal shape viewed from top, a hexagonal-pyramid shape viewed from perspective and a plurality of inclined sidewalls S4. The inclined sidewall S4 is a triangular inclined surface and includes two inclined sides L1 viewed from cross-section. The inclined sidewalls S4 are connected to each other with the inclined side L1. The cavity 151 extends downward from the first rough surface S1 of the second semiconductor layer 15 into the second semiconductor layer 15 or into the light-emitting layer 13. Each of the plurality of cavities 151 includes a deepest point P1 which is randomly distributed in the second semiconductor layer 15. A depth D1 or a width W1 of one of the plurality of cavities 151 is different with that of another one of the plurality of cavities 151. In one embodiment, the thickness T2 of the second semiconductor layer 15 can be between 500 Å and 20000 Å, and the width W1 is approximately similar to or larger than the depth D1.

As shown in FIG. 5, an angle θ1 between the inclined side L1 and c-plane is between 10 and 75 degrees, preferably 57 degrees.

FIG. 8 illustrates a perspective diagram of the light-emitting device 1 or 2 after reducing gas treatment. FIG. 9 illustrates a tilted SEM diagram of the light-emitting device 1 or 2 after reducing gas treatment in accordance with an embodiment of the present application. FIG. 10 illustrates a cross-sectional SEM diagram of the light-emitting device 1 or 2 after reducing gas treatment in accordance with an embodiment of the present application. As shown in FIG. 8, the cavity 152 includes a substantially hexagonal shape viewed from top, a cone shape viewed from perspective and a curved sidewall S5. The curved sidewall S5 surrounds the cavity 152 continuously, and includes a curved edge L2 viewed from cross-section. The cavity 152 extends downward from the second rough surface S3 of the second semiconductor layer 15 into the second semiconductor layer 15 or into the light-emitting layer 13. Each of the plurality of cavities 152 includes a deepest point P2 which is randomly distributed in the second semiconductor layer 15 A depth D2 or a width W2 of one of the plurality of cavities 152 is different with that of another one of the plurality of cavities 152. The second rough surface S3 is substantially devoid of a flat plane parallel to the epitaxial growth plane S2 of the substrate 10. In one embodiment, 80% above of the second rough surface S3 is devoid of a plane, such as c-plane, parallel to the epitaxial growth plane S2 of the substrate 10, such as c-plane. The second rough surface S3 includes the crystal plane like a-plane or m-plane, which are less reactive with the reducing gas than c-plane. In one embodiment, the width W2 is approximately similar to or larger than the depth D2. In one embodiment, the width W2 is approximately similar to the width W1 or the depth D2 is approximately similar to the depth D1.

As shown in FIG. 8, an angle θ 2 between a tangent line (not shown) of the curved edge L2 and c-plane is between 10 and 75 degrees, preferably 41 degrees. The angle θ 2 of the cavity 152 after reducing gas treatment is smaller than the angle θ 1 of the cavity 151 before reducing gas treatment. In an embodiment of the present application, the angle θ 2 of one of the plurality of cavities 152 can be different with that of another one of the plurality of cavities 152. Part of the plurality of cavities 152 are spaced apart from one another with a gap D3, wherein a surface of the gap D3 includes a curved shape viewed from cross-section. Another part of the plurality of cavities 152 are directly connected with one another as shown in FIG. 9. As shown in FIG. 10, a protrusion 153 between any two of the cavities 152 includes a curved shape viewed from cross-section. A bottom portion (not shown) of one of the plurality of cavities 152 includes a curved shape viewed from cross-section. Optionally, a sidewall of one of the plurality of cavities 152 includes different inclined surfaces wherein a joint between the different inclined surfaces (not shown) is rounded.

Figure 11:
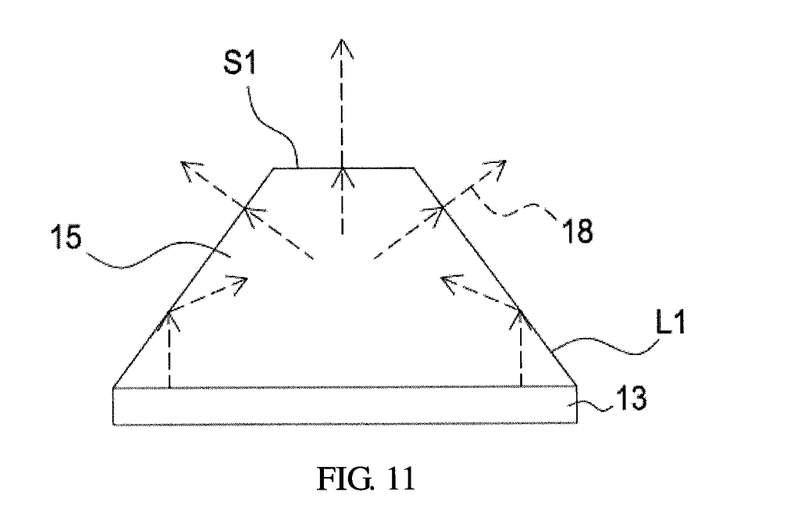
FIG. 11 illustrates a cross-sectional diagram of a light-emitting device along line X-X' of FIG. 5 before reducing gas treatment.

FIG. 11 illustrates a cross-sectional diagram of the light-emitting device 1 or 2 along line X-X' of FIG. 5 before reducing gas treatment. In one embodiment, the second semiconductor layer 15 has a polarity opposite to that of the first semiconductor layer 12. For example, the second semiconductor layer 15 can be a p-type semiconductor layer and the first semiconductor layer 12 can be an n-type semiconductor layer. A light 18 is generated in a light emitting region (not shown) of the light-emitting layer 13 through recombination of holes injected from the p-type semiconductor layer and electrons injected from the n-type semiconductor layer. The light 18 emitted from the light-emitting layer 13 can be extracted to the outside of the light-emitting device 1 or 2 from the first rough surface S1 and the inclined sidewall L1 of the second semiconductor layer 15. However, the inclined sidewall L1 is an even surface, and part of the light 18 not within the critical angle of the second semiconductor layer 15 is totally reflected on the first rough surface S1 and the inclined sidewall L1. In addition, part of the light 18 is absorbed during repeated total reflection within the semiconductor layers of the light-emitting device 1 or 2, resulting in lower external quantum efficiency.

Figure 12:
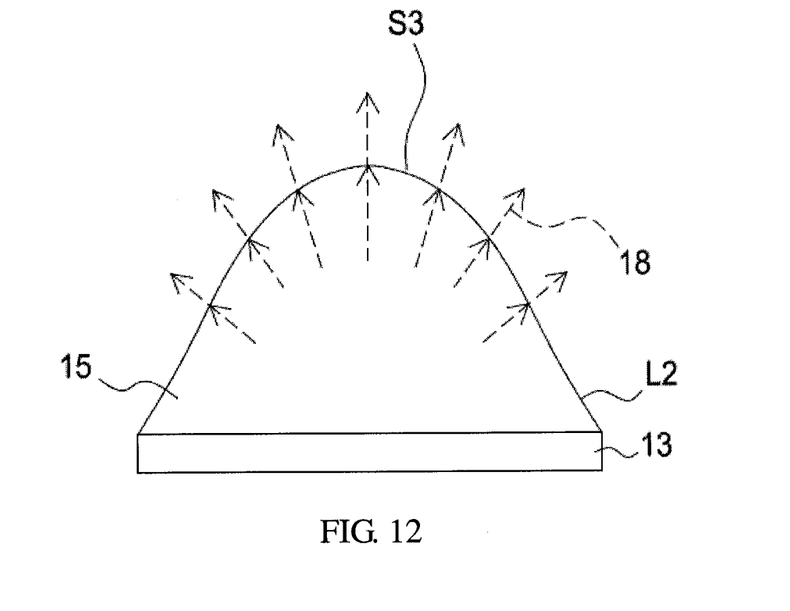
FIG. 12 illustrates a cross-sectional diagram of a light-emitting device along line Y-Y' of FIG. 8 after reducing gas treatment.

FIG. 12 illustrates a cross-sectional diagram of the light-emitting device 1 or 2 along line Y-Y' of FIG. 8 after reducing gas treatment. The light 18 emitted from the light-emitting layer 13 can be extracted to the outside of the light-emitting device 1 or 2 from the second rough surface S3 and the curved sidewall L2. The second rough surface S3 is substantially devoid of the flat plane parallel to the epitaxial growth plane S2 of the substrate 10. The second rough surface S3 and the curved sidewall L2 reduce the possibility of total internal reflection. The light extraction efficiency of the light-emitting device 1 or 2 after reducing gas treatment is improved compared with that of the light-emitting device 1 or 2 before reducing gas treatment since the total reflection is reduced.

Figure 13A:
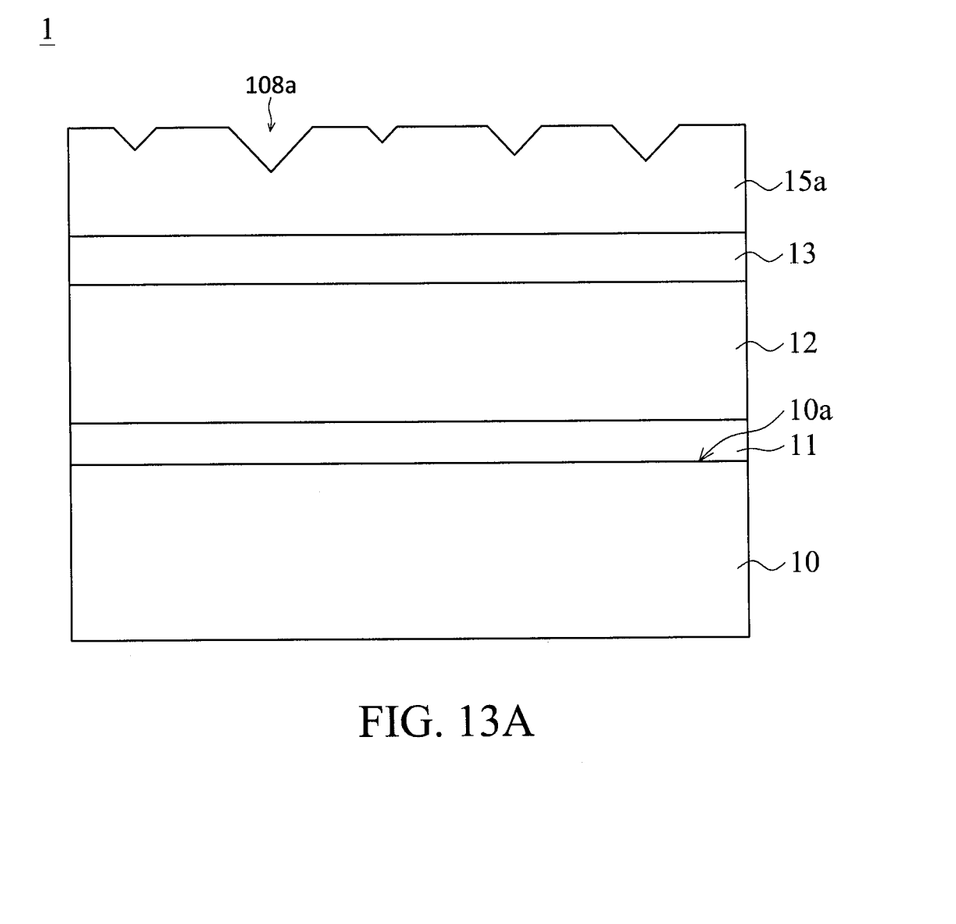
FIGS. 13A to 13B illustrate a manufacturing method of a light-emitting device in accordance with one embodiment of the present application.
Figure 13B:
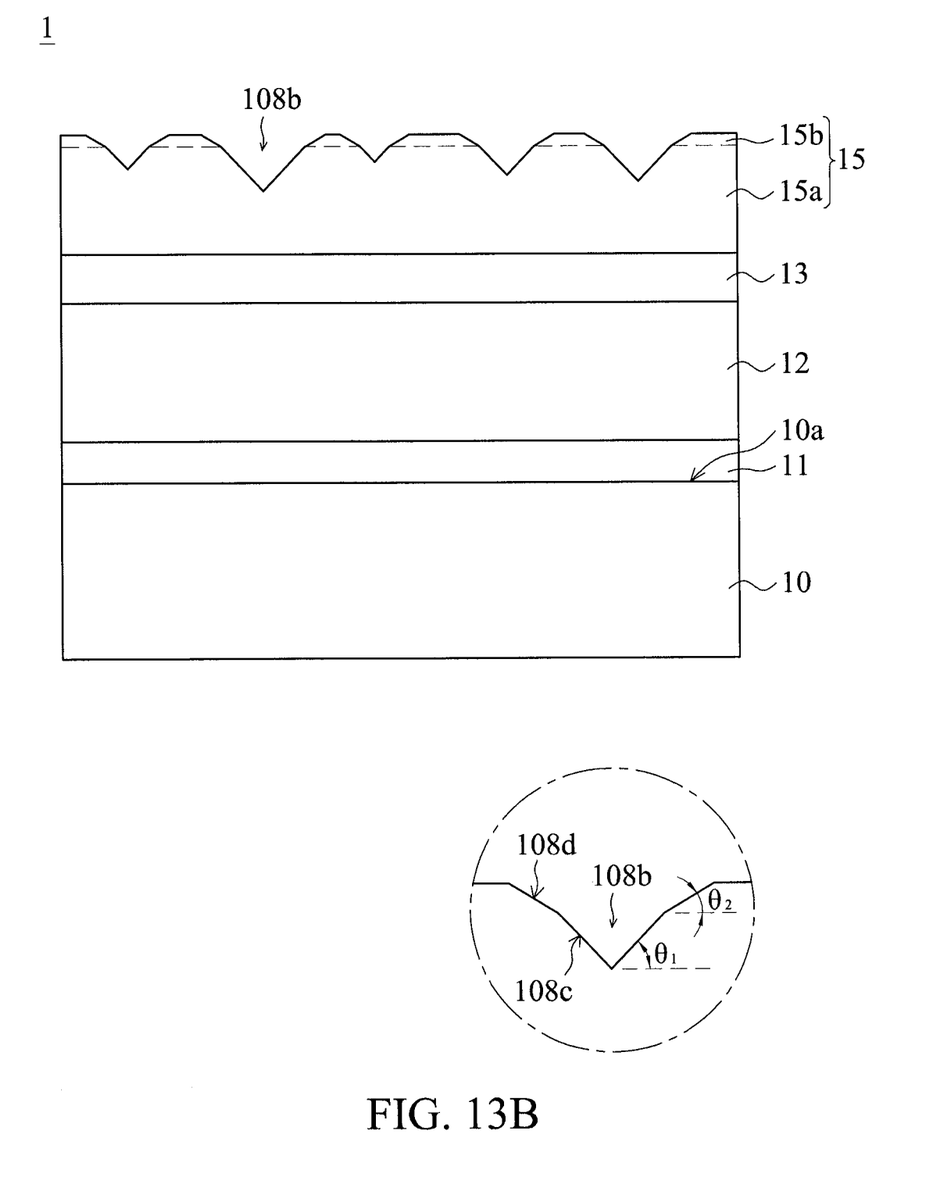

FIG. 13A to FIG. 13B illustrate a manufacturing method of a light-emitting device 1 in accordance with an embodiment of the present application. The manufacturing method includes following steps.

Step 1: placing a substrate 10 such as a sapphire substrate on a substrate holder (not shown) in an MOCVD reaction chamber (not shown). The substrate 10 includes a first surface 10a exposed for epitaxial growth.

Step 2: heating the substrate holder to maintain the first surface 10a at a proper temperature. After the heating step, a nitrogen is treated to the first surface 10a. The first surface 10a can be proceeded under a nitrogen atmosphere to become a nitridation surface which can enhance the following epitaxy quality.

Step 3: forming a buffer layer 11 on the first surface 10a of the substrate 10. A first carrier gas, a first precursor and a second precursor are introduced into the MOCVD reaction chamber. The first carrier gas is used to move the first and second precursors. After the precursors reacting, the buffer layer 11 is deposited on the first surface 10a of the substrate 10. The first carrier gas can include Nitrogen ($N_2$), and the buffer layer 11 is formed on the first surface in a first atmosphere including the first carrier gas $N_2$. The first precursor includes a Group III element, and the second precursor includes a Group V element. In detail, the chemical formula of the first precursor includes the Group III element, and the chemical formula of the second precursor includes the Group V element. The first precursor can include Trimethylindium (TMI) including In, Trimethylgallium (TMG) including Ga or Trimethylaluminium (TMA) including Al. The second precursor can include ammonia ($NH_3$) including N. The first carrier gas $N_2$ moves the first precursor TMA and The second precursor $NH_3$ into the MOCVD reaction chamber to form an AlN layer as the buffer layer 11, or moves the first precursor TMG into the MOCVD chamber to form a GaN layer as the buffer layer 11. In one embodiment, when forming the AlN buffer layer 11, the first precursor TMA can be introduced into the MOCVD reaction chamber with the first carrier gas $N_2$ before the second precursor $NH_3$. In another one embodiment, when forming the GaN buffer layer 11 the first carrier gas may move the first precursor TMG and the second precursor $NH_3$ into the MOCVD reaction chamber at the same time.

Step 4: forming a first semiconductor layer 12 on the buffer layer 11. A second carrier gas, the first precursor TMG, the second precursor $NH_3$ and a third precursor are introduced into the MOCVD reaction chamber. The second carrier gas is used to move the precursors. After the precursors reacting, the first semiconductor layer 12 is deposited on the buffer layer 11. The third precursor includes n-type dopant and can be $SiH_6$, including Si, being an impurity to dope the first semiconductor layer 12 to be n-type. Accordingly, the first semiconductor layer 12 includes GaN. In one embodiment a fourth precursor TMA is further introduced to form the first semiconductor layer 12 including AlGaN. The second carrier gas can include Hydrogen ($H_2$), and the first semiconductor layer 12 is formed on the buffer layer 11 in a second atmosphere including the second carrier gas $H_2$. In this step, the first carrier gas $N_2$ is stopped to be introduced into the MOCVD reaction chamber before the second carrier gas $H_2$, the first precursor and the second precursor are introduced.

Step 5: forming a light-emitting layer 13 having a structure, such as multiple-quantum-well (MQW) structure including barrier layers and well layers on the first semiconductor layer 12. The first carrier gas $N_2$, the first precursor TMG, a fifth precursor TMI, the second precursor $NH_3$ and the third precursor $SiH_6$ are introduced into the MOCVD reaction chamber to form the light-emitting layer 13 on the first semiconductor layer 12. The light-emitting layer 13 is formed on the first semiconductor layer 12 in the first atmosphere including the first carrier gas $N_2$. The first carrier gas $N_2$ moves the first precursor TMG and the second precursor $NH_3$ into the MOCVD reaction chamber to form GaN barrier layers, and the fifth precursor TMI is introduced reacting with first precursor TMG and second precursor $NH_3$ to form well layers, the barrier layers and the well layers are formed intermittently, therefore the light-emitting layer 13 including alternating GaN barrier layers (not shown) and InGaN well layers (not shown) is formed on the first semiconductor layer 12. During forming the GaN barrier layers, the third precursor $SiH_6$ including Si can be introduced into the MOCVD reaction chamber, therefore the GaN barrier layer is doped to be n-type. The light-emitting layer 13 including GaN barrier layers and InGaN well layers can emit green, blue or UV light. The material of the barrier layer and/or the well layer of the light-emitting layer 13 can also include AlGaN based material. The light-emitting layer 13 including AlGaN based material can emit light having high power such as deep UV light. In this step, the second carrier gas $H_2$ is stopped to be introduced into the MOCVD reaction chamber, only the first carrier gas $N_2$ is introduced into the MOCVD reaction chamber.

Step 6: forming a first portion 15a of a second semiconductor layer 15 on the light-emitting layer 13. The first carrier gas $N_2$, the first precursor TMG, the second precursor $NH_3$, and a sixth precursor are introduced into the MOCVD reaction chamber. The first portion 15a is formed on the light-emitting layer 13 in a third atmosphere including the first carrier gas $N_2$ without the second carrier gas $H_2$. The first carrier gas $N_2$ is used to move the precursors, after the precursors reacting, the first portion 15a of a second semiconductor layer 15 is deposited on the light-emitting layer 13. The sixth precursor includes p-type dopant and can be $CP_2Mg$, including Mg, being an impurity to dope the first portion 15a to be p-type. Accordingly the first portion 15a includes GaN. In one embodiment, the fourth precursor TMA is further introduced to form the first portion 15a including AlGaN. A plurality of first cavities 108a is formed on a surface of the first portion 15a within the duration of forming the first portion 15a. In accordance with a lattice mismatch between the substrate 10 and the epitaxial growth layers grown above the substrate 10, some dislocations (not shown) are generated within the layers, and dislocations can be performed as the first cavities 108a by lowering the temperature of the reaction chamber when forming the first portion 15a. In another embodiment, the third atmosphere can be a mixture including the first carrier gas $N_2$ and the second carrier gas $H_2$, and a gas flow rate (Standard Liters per Minute, SLPM) of the second carrier gas $H_2$ is less than that of the first carrier gas $N_2$. In one embodiment, before forming the first portion 15a of the second semiconductor layer 15, an electron-blocking layer (not shown) can be formed on the light-emitting layer 13. In a step of forming the electron-blocking layer, the first carrier gas $N_2$ can move the first precursor TMG, the fourth precursor TMA and the second precursor $NH_3$ into the MOCVD reaction chamber to form the electron-blocking layer. In another embodiment, the sixth precursor $CP_2Mg$ can be further introduced into the MOCVD reaction chamber to form a p-type electron-blocking layer. The electron-blocking layer is formed between the light-emitting layer 13 and the first portion 15a of the second semiconductor layer 15.

Step 7: forming a second portion 15b on the first portion 15a therefore forming the second semiconductor layer 15. The second carrier gas $H_2$, the first precursor TMG, the second precursor $NH_3$ and the sixth precursor $Cp_2Mg$ are introduced into the MOCVD reaction chamber. The second portion 15b is formed on the first portion 15a in a fourth atmosphere including the second carrier gas $H_2$ without the first carrier gas $N_2$. The second carrier gas $H_2$ is used to move the precursors, after the precursors reacting, the second portion 15b of the second semiconductor layer 15 is deposited on the first portion 15a. Accordingly the second portion 15b includes GaN. In one embodiment, the fourth precursor TMA is further introduced to form the second portion 15b including AlGaN. The plurality of first cavities 108a is transformed to a plurality of second cavities 108b on surfaces of the second portion 15b and extending to the first portion 15a within the duration of forming the second portion 15b, and one of the second cavities 108b has a first inclined surface 108c and a second inclined surface 108d above and connecting the first inclined surface 108c in a cross-sectional view. The first inclined surface 108c has a larger slope than the second inclined surface 108d. In the cross-sectional view, the first inclined surface 108c is relative to the first surface 10a with an angle $θ_1$, and the second inclined surface 108d is relative to the first surface 10a with an angle $θ_2$, wherein $θ_1 > θ_2$. In one embodiment, the sidewalls of the first cavities 108a is etched by the second carrier gas $H_2$ in association with the deposition of the second portion 15b, therefore at least one of the second cavities 108b have a first inclined surface 108c and a second inclined surface 108d above the first inclined surface 108c. The slope of the surface of the first cavities 108a is different from the first inclined surface 108c of the second cavities 108a. In this step, the first carrier gas $N_2$ is stopped to be introduced into the MOCVD reaction chamber. In another embodiment, the fourth atmosphere can be a mixture including the second carrier gas $H_2$ and the first carrier gas $N_2$, and a gas flow rate (Standard Liters per Minute, SLPM) of the second carrier gas $H_2$ is higher than that of the first carrier gas $N_2$. In the embodiment, the material of the first semiconductor layer 12, the light-emitting layer 13 and the second semiconductor layer 15 include $Al_xGa_yIn_{1-x-y}N$, wherein $0 \leq x \leq 1$.

After forming the second semiconductor layer 15, some steps such as annealing, etching a portion of the second semiconductor layer 15 and the light-emitting layer 13 to expose a part of the first semiconductor layer 12, forming electrodes (not shown) on the first semiconductor layer 12 and the second semiconductor layer 15 can be provided to complete the fabrication of the light-emitting device 1.

Figure 14A:
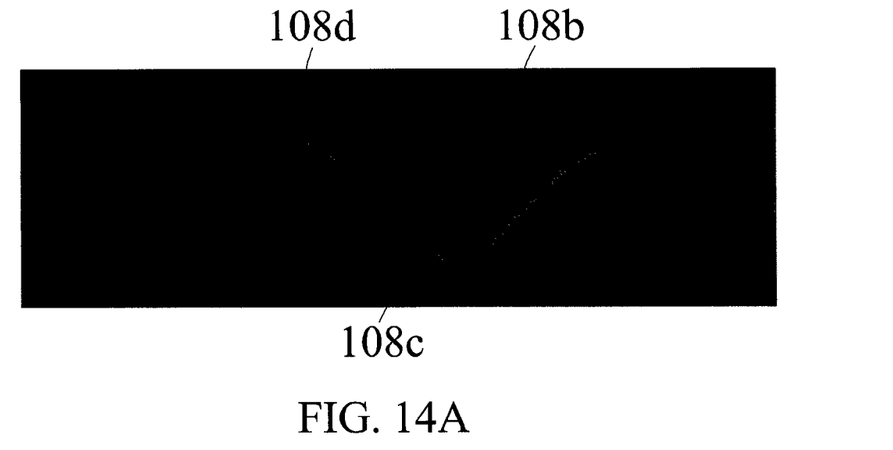
FIG. 14A illustrates a cross-sectional SEM diagram of a cavity of a light-emitting device in accordance with one embodiment of the present application.

Please referring to FIG. 14A, a cross-sectional SEM diagram of the second cavity 108b of a light-emitting device in accordance with one embodiment is shown. The second cavity 108b includes a depth D, and the vertical height of the first inclined surface 108c is $H_1$, and the vertical height of the second inclined surface 108d is $H_2$, wherein $D=H_1+H_2$, and $1.5 \leq H_1/H_2 \leq 2$.

Figure 14B:
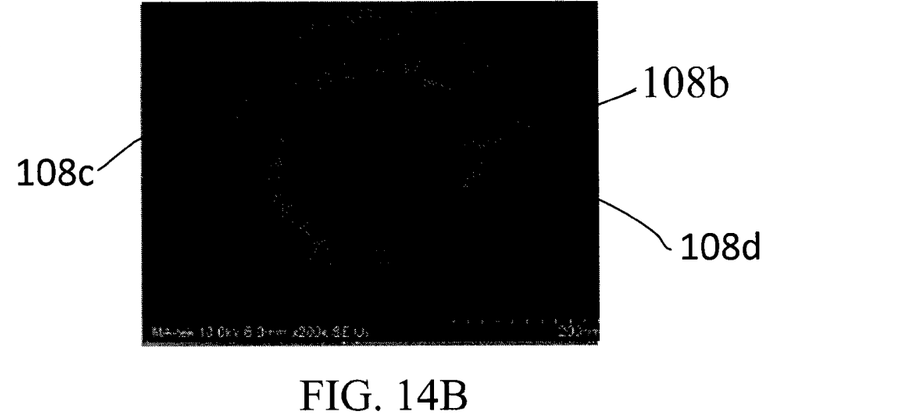
FIG. 14B illustrates a top-view SEM diagram of a cavity of a light-emitting device in accordance with one embodiment of the present application.

Please referring to FIG. 14B, a top-view SEM diagram of the second cavity 108b of a light-emitting device in accordance with one embodiment of the present application is shown. From a top view, the second cavity 108b includes hexagonal form.

Figure 14C:
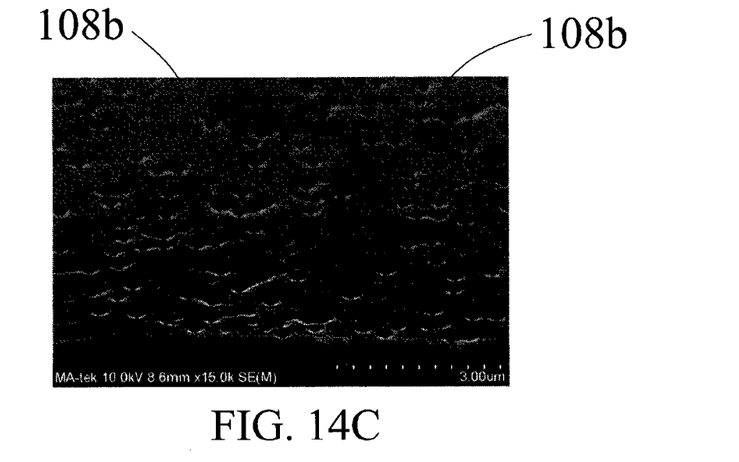
FIG. 14C illustrates a tilted SEM diagram of a light-emitting device in accordance with one embodiment of the present application.

Please referring to FIG. 14C, a tilted SEM diagram of a light-emitting device in accordance with one embodiment of the present application is shown. In FIG. 14C, the plurality of second cavities 108b forms a random distribution.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. An LED manufacturing method comprising steps of:
    providing a substrate comprising a first surface;
    forming a first portion of a first semiconductor layer on the first surface in a reaction chamber in a first atmosphere comprising a first carrier gas; and
    forming a second portion of the first semiconductor layer on the first portion in the reaction chamber in a second atmosphere comprising a second carrier gas;
    wherein a plurality of first cavities is formed on a surface of the first portion during forming the first portion; and
    wherein the plurality of first cavities is transformed to a plurality of second cavities during forming the second portion, and one of the second cavities comprises a first inclined surface and a second inclined surface above the first inclined surface.

2. The LED manufacturing method according to claim 1, wherein the first inclined surface has a larger slope than the second inclined surface.

3. The LED manufacturing method according to claim 1, wherein the first carrier gas is $N_2$, and the second carrier gas is $H_2$, and wherein the first atmosphere is devoid of the second carrier gas, and the second atmosphere is devoid of the first carrier gas.

4. The LED manufacturing method according to claim 1, wherein the first atmosphere comprises the first carrier gas and the second carrier gas, and a gas flow rate of the first carrier gas is higher than that of the second carrier gas.

5. The LED manufacturing method according to claim 4, wherein the first carrier gas is $N_2$, and the second carrier gas is $H_2$.

6. The LED manufacturing method according to claim 1, wherein the second atmosphere comprises the first carrier gas and the second carrier gas, and a gas flow rate of the second carrier gas is higher than that of the first carrier gas.

7. The LED manufacturing method according to claim 6, wherein the first carrier gas is $N_2$, and the second carrier gas is $H_2$.

8. The LED manufacturing method according to claim 1, wherein one of the first cavity is etched by the second carrier gas to form the first inclined surface and the second inclined surface.

9. The LED manufacturing method according to claim 1, wherein each of the second cavities comprises a hexagonal form in a top view.

10. The LED manufacturing method according to claim 1, before forming the first semiconductor layer, further comprising steps of: forming a second semiconductor layer on the first surface of the substrate; and forming a light-emitting layer on the second semiconductor layer.

11. The LED manufacturing method according to claim 10, wherein the substrate is placed in a MOCVD reaction chamber, and the second carrier gas, a first precursor, a second precursor and a third precursor are introduced into the MOCVD reaction chamber, wherein the first precursor comprises a Group III element, the second precursor comprises a Group V element and the third precursor comprises an n-type dopant, wherein the second carrier gas moves the first, second, and third precursors to deposit the second semiconductor layer on the first surface.

12. The LED manufacturing method according to claim 11, wherein the Group III element comprises Ga or Al.

13. The LED manufacturing method according to claim 11, after the second semiconductor layer is formed, the first carrier gas, the first precursor, the second precursor and the third precursor are introduced into the MOCVD reaction chamber, wherein the first carrier gas moves the first, second, and third precursors to deposit the light-emitting layer on the second semiconductor layer.

14. The LED manufacturing method according to claim 13, wherein the Group III element comprises Ga or Al.

15. The LED manufacturing method according to claim 10, wherein the substrate is placed in a MOCVD reaction chamber, and after the light-emitting layer is formed, the first carrier gas, a first precursor, a second precursor and a third precursor are introduced into the MOCVD reaction chamber, wherein the first precursor comprises a Group III element, the second precursor comprises a Group V element and the third precursor comprises a p-type dopant, wherein the first carrier gas moves the first, second, and third precursors to deposit the first portion on the light-emitting layer.

16. The LED manufacturing method according to claim 15, after the first portion is formed, the second carrier gas, the first precursor, the second precursor and the third precursor are introduced into the MOCVD reaction chamber, wherein the second carrier gas moves the first, second, and third precursors to deposit the second portion on the first portion.

17. The LED manufacturing method according to claim 15, wherein the Group III element comprises Ga or Al.

18. The LED manufacturing method according to claim 16, wherein the Group III element comprises Ga or Al.

19. The LED manufacturing method according to claim 10, before forming the second semiconductor layer, further comprising a step of: forming a buffer layer on the first surface of the substrate.

20. The LED manufacturing method according to claim 1, wherein a vertical height corresponding to the first inclined surface is $H_1$, and a vertical height corresponding to the second inclined surface is $H_2$, and $1.5 \leq H_1/H_2 \leq 2$.

21. The LED manufacturing method according to claim 1, wherein each of the second cavities comprises a deepest point, and at least two of the second cavities have different distances from the deepest point to the first surface.

22. The LED manufacturing method according to claim 1, wherein the reaction chamber is a MOCVD reaction chamber.

23. The LED manufacturing method according to claim 1, wherein the first semiconductor layer further comprises a top surface substantially parallel to the first surface, and the second inclined surface is directly connected to the first inclined surface and the top surface.

* * * * *